(12) United States Patent
Yang

(10) Patent No.: US 7,482,261 B2
(45) Date of Patent: Jan. 27, 2009

(54) INTERCONNECT STRUCTURE FOR BEOL APPLICATIONS

(75) Inventor: Chih-Chao Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 140 days.

(21) Appl. No.: 11/460,011

(22) Filed: Jul. 26, 2006

(65) Prior Publication Data

US 2008/0026554 A1    Jan. 31, 2008

(51) Int. Cl.
*H01L 21/4763* (2006.01)

(52) U.S. Cl. .................. 438/619; 438/421; 438/422; 438/319; 438/627; 438/653; 257/276; 257/522; 257/E21.581

(58) Field of Classification Search ............... 438/619, 438/422, 421
See application file for complete search history.

(56) References Cited

U.S. PATENT DOCUMENTS

| | | | |
|---|---|---|---|
| 5,098,860 A | 3/1992 | Chakravorty et al. | |
| 5,930,669 A | 7/1999 | Uzoh et al. | |
| 5,933,753 A | 8/1999 | Simon et al. | |
| 6,383,920 B1 | 5/2002 | Wang et al. | |
| 6,429,519 B1 | 8/2002 | Uzoh et al. | |
| 2005/0275104 A1* | 12/2005 | Stamper | 257/758 |

\* cited by examiner

*Primary Examiner*—Ha Tran T Nguyen
*Assistant Examiner*—Chakila Tillie
(74) *Attorney, Agent, or Firm*—Scully, Scott, Murphy & Presser, P.C.; Lisa U. Jaklitsch, Esq.

(57) ABSTRACT

A semiconductor interconnect structure is provided that includes a new capping layer/dielectric material interface which is embedded inside the dielectric material. In particular, the new interface is an air gap that is located in the upper surface of a dielectric material that is adjacent to a conductive region or feature. The air gap may be unfilled, partially filled or completely filled with either a dielectric capping layer or an upper dielectric material. The presence of the air gap in the upper surface of the dielectric material that is adjacent to the conductive region or feature provides a new interface that has a high mechanical strength and thus the resultant structure is highly reliable. Moreover, the new interface provided in the present invention has a high dielectric breakdown resistance which is important for future technology extendibility. Moreover, it is noted that the new interface is provided utilizing processing steps that are compatible with existing interconnect technology without added cost.

14 Claims, 8 Drawing Sheets

INTERCONNECT STRUCTURE FOR BEOL APPLICATIONS

FIELD OF THE INVENTION

The present invention relates to a semiconductor structure and a method of fabricating the same. More particularly, the present invention relates to an interconnect structure with high mechanical integrity strength at the cap/dielectric/barrier interface which enhances the reliability of the integrated circuit (IC). The present invention also provides an interconnect structure with a high dielectric breakdown resistance which is extremely important for future technology extendibility. The present invention also provides a method of fabricating such an interconnect structure having a high mechanical integrity strength and high dielectric breakdown resistance.

BACKGROUND OF THE INVENTION

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

With continuous scaling and introduction of low k (on the order of less than 4.0) dielectrics in Cu interconnects, reliability issues have become a greater concern in addition to increased process complexity. One reliability issue that is a concern in current Cu based interconnect structures (as well as other metal based interconnect structures) is caused by the weak mechanical interface at the cap/dielectric/barrier interface.

FIG. 1A is a cross sectional view of a prior art interconnect structure showing the mechanically weak interface. Specifically, the prior art interconnect structure 10 shown in FIG. 1A comprises a dielectric material 12 having a dielectric constant of about 4.0 or less. Embedded within the dielectric material 12 is a conductive (e.g., Cu) material 16 that is separated from the dielectric material 12 by a diffusion barrier 14. A capping layer 18 is located atop the dielectric material 12 as well as upper portions of the diffusion barrier 14 and on the conductive material 16. The prior art interconnect structure 10 is mechanically weak at the triple interface that is formed between the capping layer 18/dielectric material 12/diffusion barrier 14. The mechanically weak interface is denoted by reference numeral 20.

Besides the reliability issues caused by the mechanically weak interface, conductive material 16 eventually diffuses into the dielectric material 12 and causes reliability degradation of the circuit. This problem is illustrated in the SEM shown in FIG. 1B. The diffusion of conductive material to the dielectric material 12 occurs readily in the absence of the diffusion barrier 14 under the influence of an electrical field. Similarly, it has also been observed that the conductive material 16, particularly Cu ions, can diffuse into the dielectric material 12 along the conductive material 16/capping layer 18 interface under normal circuit operations. This is shown, for example, in FIG. 1C where reference numeral 22 denotes the direction of the diffusion.

In view of the above, there is a need for providing a new and improved interconnect structure wherein the above-mentioned drawbacks with prior art interconnect structures have been substantially eliminated.

SUMMARY OF THE INVENTION

The present invention provides a semiconductor interconnect structure with high mechanical integrity strength at the capping layer/dielectric material/diffusion barrier interface which, in turn, enhances the circuit reliability. The present invention also provides a semiconductor interconnect structure that has a high dielectric breakdown resistance (on the order of about 10 or greater) which, in turn, is important for future technology extendibility. The present invention also provides a method of fabricating such a semiconductor interconnect structure which is compatible with current interconnect processing without adding an extra masking step and/or cost.

According to the present invention, a semiconductor interconnect structure is provided that includes a new capping layer/dielectric material interface which is embedded inside the dielectric material. In particular, the new interface is an air gap that is located in the upper surface of a dielectric material that is adjacent to a conductive region or feature. The air gap may be unfilled, partially filled or completely filled with either a dielectric capping layer or an upper dielectric material. The presence of the air gap in the upper surface of the dielectric material that is adjacent to the conductive region or feature provides a new interface that has a high mechanical strength and thus the resultant structure is highly reliable. Moreover, the new interface provided in the present invention has a high dielectric breakdown resistance which is important for future technology extendibility. Moreover, it is noted that the new interface is provided utilizing processing steps that are compatible with existing interconnect technology without added cost.

In general terms, the present invention provides a semiconductor interconnect structure that comprises:

a dielectric material that has at least one conductive region embedded therein, said at least one conductive region is separated from said dielectric material by a diffusion barrier and an air gap, said air gap is located within an upper surface of said dielectric material between said diffusion barrier and said dielectric material.

In one preferred embodiment of the present invention, the semiconductor interconnect structure comprises:

a lower dielectric material that has at least one conductive region embedded therein, said at least one conductive region is separated from said lower dielectric material by a diffusion barrier and an air gap, said air gap is located within an upper surface of said lower dielectric material between said diffusion barrier and said lower dielectric material;

a dielectric capping layer disposed at least on said lower dielectric material, wherein a portion of said dielectric capping layer is located within said air gap; and an upper dielectric material located on said dielectric capping layer.

In another preferred embodiment of the present invention, the semiconductor interconnect structure comprises:

a lower dielectric material that has at least one conductive region embedded therein, said at least one conductive region is separated from said lower dielectric material by a diffusion barrier and an air gap, said air gap is located within an upper surface of said lower dielectric material between said diffusion barrier and said lower dielectric material;

a metal cap disposed on said at least one conductive region; and an upper dielectric material located on said dielectric capping layer, wherein a portion of said upper dielectric material is located within said air gap.

In addition to the semiconductor interconnect structure mentioned above, the present invention also provides a method of fabricating the same. In general terms, the method of the present invention comprises:

providing at least one opening in a dielectric material;

forming an organic planarization material within a lower portion of said at least one opening;

forming a surface oxide region on bare sidewall portions of said at least one opening, not protected with said organic planarization material;

removing said organic planarization material from said at least one opening;

filling said at least one opening with a diffusion barrier and a conductive material;

planarizing the diffusion barrier and the conductive material to provide a structure wherein said diffusion barrier and said conductive material each have an upper surface that is substantially coplanar with the upper surface of the dielectric material; and removing the surface oxide region from said sidewall portions of said at least one opening to provide an air gap between said diffusion barrier and said dielectric material.

DETAILED DESCRIPTION OF THE INVENTION

The present invention, which provides a semiconductor interconnect structure having high mechanical strength and high dielectric breakdown resistance as well as a method of fabricating the same, will now be described in greater detail by referring to the following discussion and drawings that accompany the present application. The drawings of the present application, which are referred to in greater detail herein below, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1A:
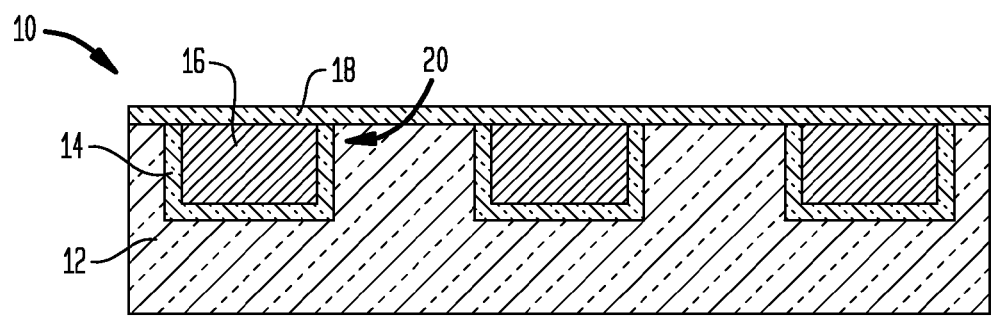
FIG. 1A is a pictorial representation (though a cross sectional view) illustrating a prior art interconnect structure including a mechanically weak interface.
Figure 1C:
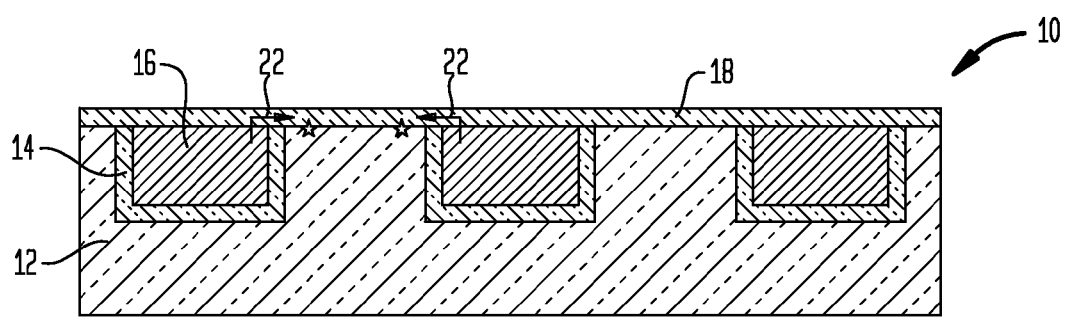
FIG. 1C is a pictorial representation (through a cross sectional view) illustrating the path of conductive material diffusion in a prior art interconnect structure.
Figure 1B:
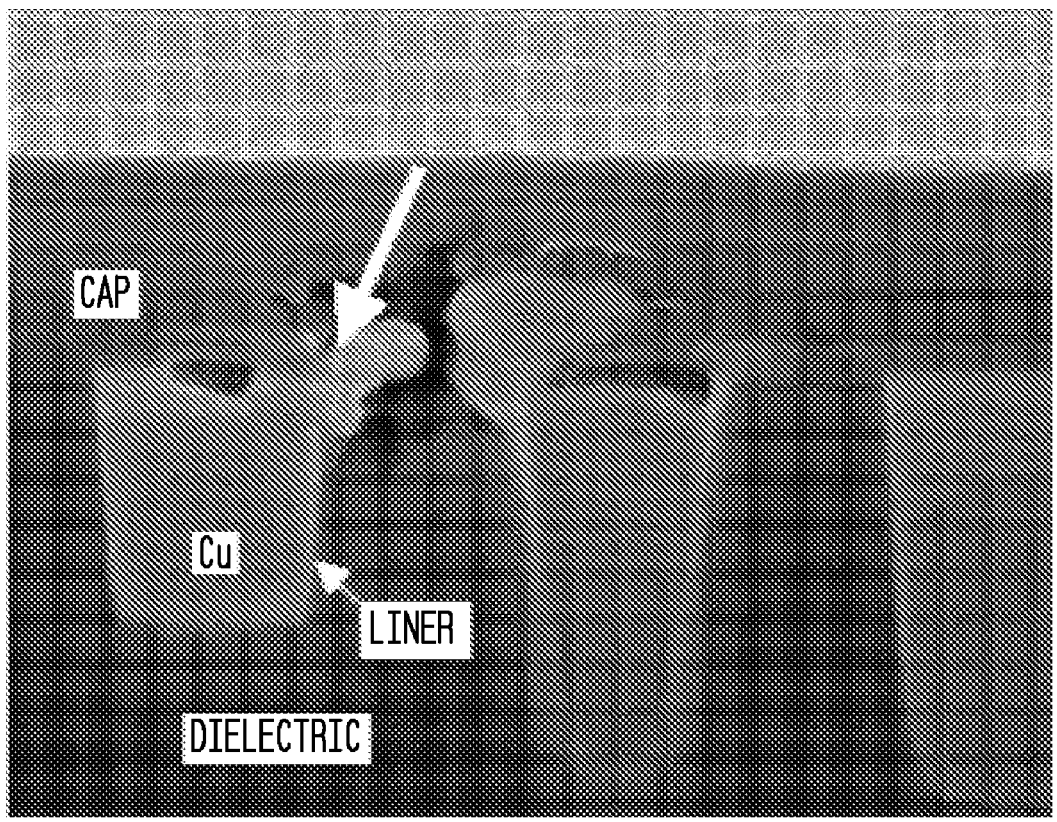
FIG. 1B is a scanning electron micrograph (SEM) of a prior art interconnect structure showing circuit reliability degradation.
Figure 2A:
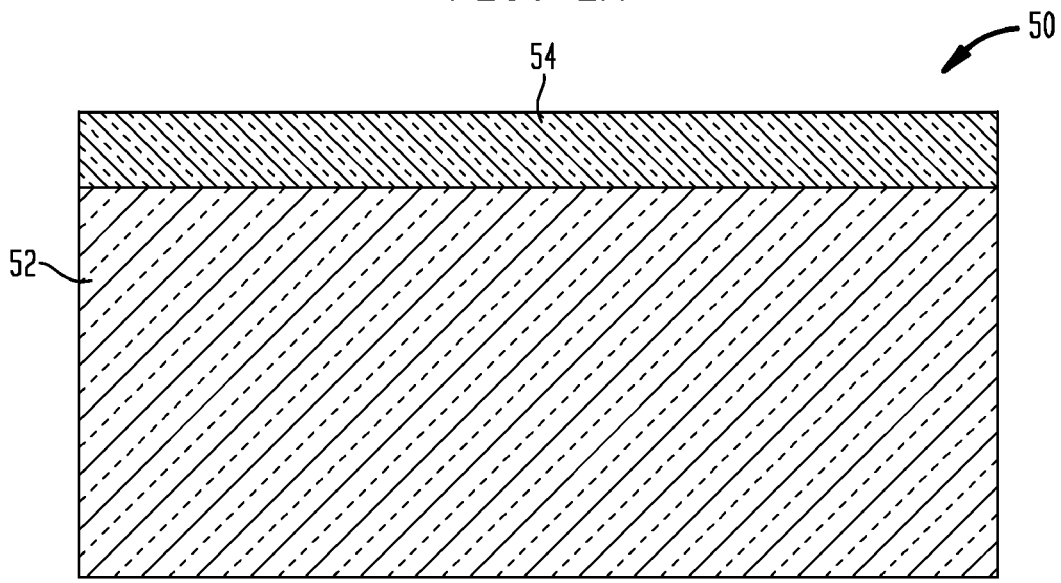
FIGS. 2A-2I are pictorial representations (through cross sectional views) illustrating an interconnect structure through various processing steps in accordance with one embodiment of the present invention.

The process flow of the present invention begins with providing the initial interconnect structure 50 shown in FIG. 2A. Specifically, the initial interconnect structure 50 shown in FIG. 2A comprises a dielectric material 52 having a sacrificial dielectric film 54 disposed on a surface thereof.

The initial interconnect structure 50 shown in FIG. 2A is made utilizing standard interconnect processing which is well known in the art. For example, the initial interconnect structure 50 can be formed by first applying the dielectric material 52 to a surface of a substrate (not shown). The dielectric material 52 may be applied by any conventional deposition process including, for example, chemical vapor deposition, plasma enhanced chemical vapor deposition, evaporation, chemical solution deposition, or spin-on coating.

The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In additional to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent a lower interconnect level of a multilayered interconnect structure.

The dielectric material 52 may comprise any interlevel or intralevel dielectric including inorganic dielectrics or organic dielectrics. The dielectric material 52 may be porous or nonporous. Some examples of suitable dielectrics that can be used as the dielectric material 52 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 52 typically has a dielectric constant that is about 4.0 or less, with a dielectric constant of about 2.8 or less being even more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric material 52 may vary depending upon the dielectric material used as well as the exact number of dielectrics layers within the dielectric material 52. Typically, and for normal interconnect structures, the dielectric material 52 has a thickness from about 50 to about 1000 nm.

After providing the dielectric material 52, the sacrificial dielectric film 54 is disposed on a surface of the dielectric material 52 utilizing any conventional deposition process such as, for example, chemical vapor deposition, plasma enhanced chemical vapor deposition, evaporation, chemical solution deposition and other like processes. Alternatively, the sacrificial dielectric film 54 can be formed by oxidation, nitridation or oxynitirdation.

The sacrificial dielectric film 54 is comprised of any insulating material including oxides, nitrides, oxynitrides, carbides or multilayers thereof. Typically, the sacrificial dielectric film 54 is comprised of one of silicon oxide, silicon nitride, silicon oxynitride, and silicon carbide. The thickness of the sacrificial dielectric film 54 may vary depending on the technique used to dispose the film on the surface of the dielectric material 52, the material of the sacrificial dielectric film itself, as well as the number of material layers within film 54. Typically, the thickness of the sacrificial dielectric film 54 formed is from about 10 to about 80 nm.

Figure 2B:
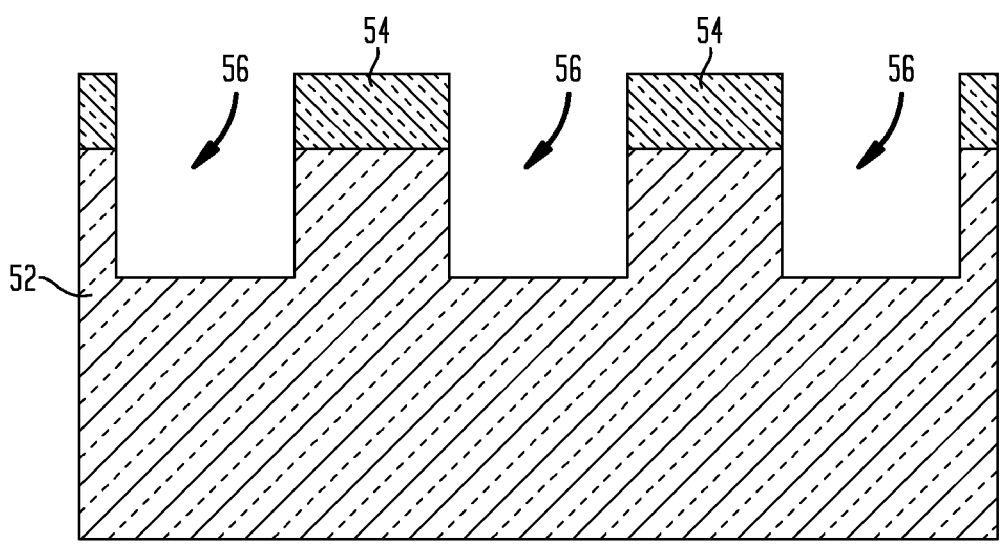

Next, and as shown in FIG. 2B, at least one opening 56 is formed through the sacrificial dielectric film 54 and into the dielectric material 52 utilizing lithography and etching. The lithographic step includes applying a photoresist to the surface of the sacrificial dielectric film 54, exposing the photoresist to a desired pattern of radiation, and developing the exposed resist utilizing a conventional resist developer. The etching step may comprise a dry etching process, a wet chemical etching process or a combination thereof. The term "dry etching" is used herein to denote an etching technique such as reactive-ion etching, ion beam etching, plasma etching or laser ablation. During the etching process, the pattern is first transferred to the sacrificial dielectric film 54 and then into the dielectric material 52. The patterned photoresist is typically, but not necessarily always, removed from the structure after the pattern has been transferred into the sacrificial dielectric film 54.

The at least one opening 56 formed into the dielectric material 52 may comprise a line opening, a via opening or a combination of a line opening and a via opening. A single damascene or dual damascene process can be used as appropriate depending on the type of opening being formed. A first via then line opening process may be used, or a first line then via opening process may be used.

Figure 2C:
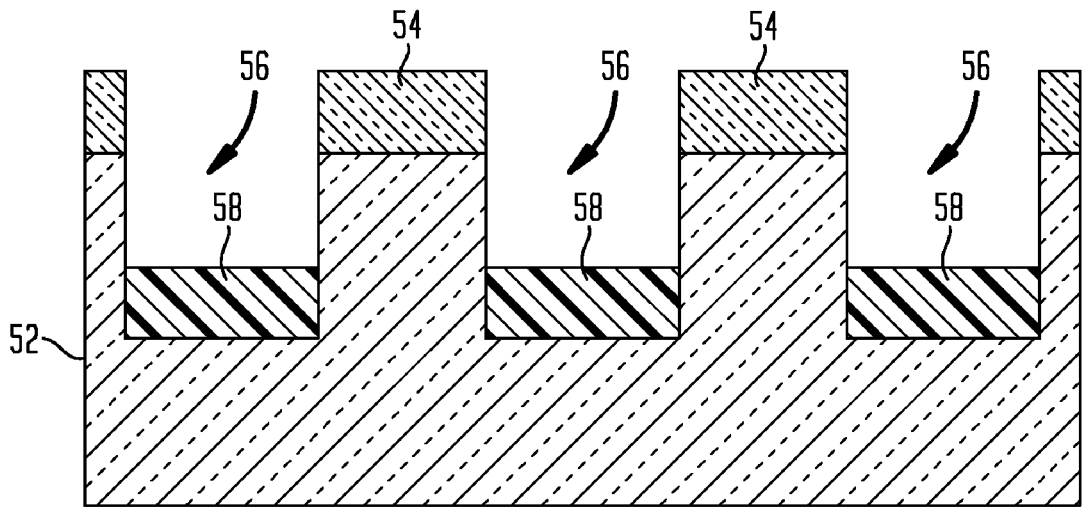

After providing the at least one opening 56 into the dielectric material 52, an organic planarization material 58 is formed within a lower portion of each of the openings providing the structure shown, for example, in FIG. 2C. The organic planarization material 58 is formed on a bottom wall portion as well as lower sidewall portions of the at least one opening 56. It is noted that upper sidewall portions of the at least one opening 56 are bare, e.g., they are not covered by the organic planarization material 58.

The organic planarization material 58 may comprise a conventional photoresist, a doped silicate glass, an acrylate, a maleimide, a lactone, admantane contained copolymers, terpolymers, and other like materials.

The organic planarization material 58 is preferably formed by a spin-on coating process. Other deposition processes such as, for example, chemical vapor deposition and plasma enhanced chemical vapor deposition, are not however excluded. The thickness of the organic planarization material 58 that is formed within the at least one opening 56 is typically from about 10 to about 800 nm.

Figure 2D:
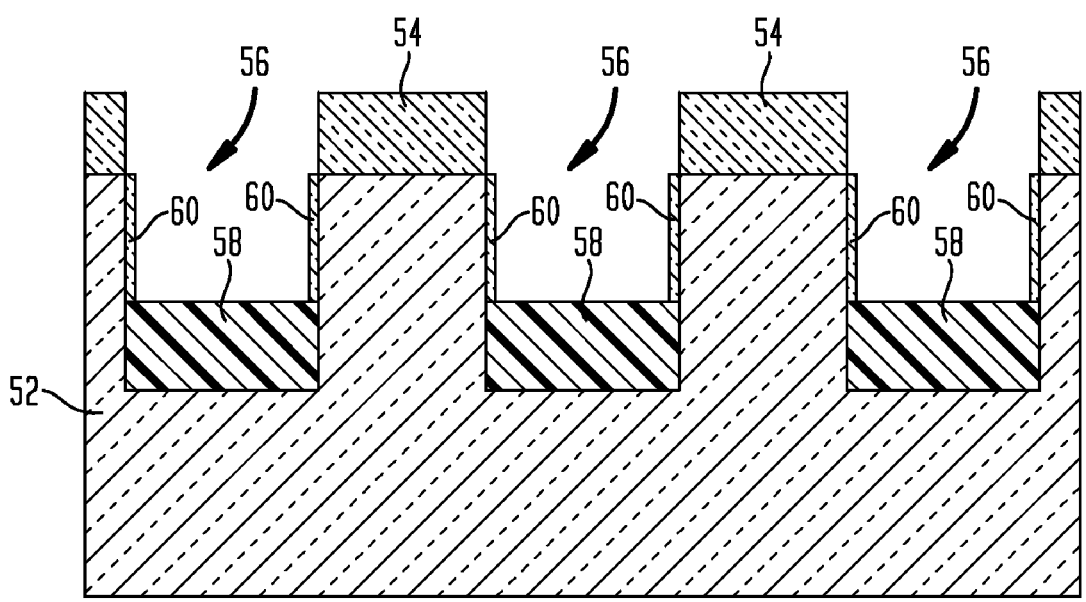

FIG. 2D shows the structure that is formed after the bare upper sidewall portions of each of the at least one openings 56 are exposed to a chemical plasma process that creates an oxide surface region 60 within the exposed portions of the dielectric material 52 that are not protected by the organic planarization material 58. The chemical plasma process includes any chemistries that are capable of forming this surface oxide region 60 within the exposed portions of the dielectric material 52 that are located at the upper portions of each of the at least one opening 56. An example of a chemical plasma process that can be employed in the present invention is one which may comprise of $O_2$, $N_2$, $H_2$, $NH_3$, or CO.

Figure 2E:
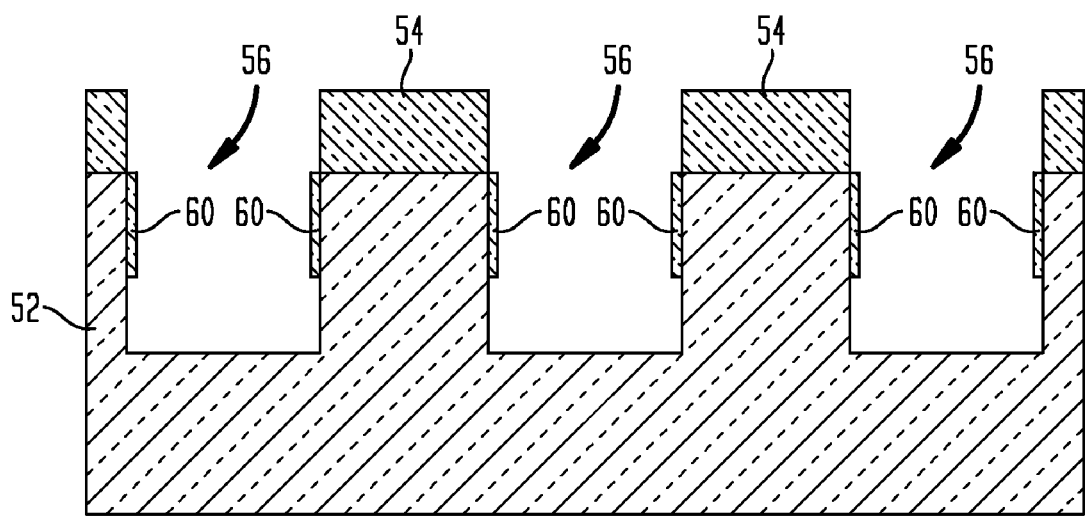

Next, and as shown in FIG. 2E, the organic planarization material 58 within each of the openings 56 is removed utilizing a wet chemical etching process that selectively removes the organic planarization material 58 relative to the other materials in the structure. An example of a wet chemical etching process that can be used is one wherein TMAH (Tetramethylammonium hydroxide) is used as the chemical etchant.

After removing the organic planarization material 58 from within each of the openings 56, the openings 56 are first lined with a diffusion barrier 62 and then with a conductive material. The conductive material forms a conductive region (or feature) 64 embedded within dielectric material 52. The diffusion barrier 62, which may comprise Ta, TaN, Ti, TiN, Ru, RuN, RuTa, RuTaN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), sputtering, chemical solution deposition, or plating.

The thickness of the diffusion barrier 62 may vary depending on the exact means of the deposition process as well as the material employed. Typically, the diffusion barrier 62 has a thickness from about 4 to about 40 nm, with a thickness from about 7 to about 20 nm being more typical.

Following the diffusion barrier 62 formation, the remaining region of each of the openings 56 within the dielectric material 52 is filled with the conductive material forming a conductive region 64 or feature. The conductive material used in forming the conductive region 64 includes, for example, polySi, a conductive metal, an alloy comprising at least one conductive metal, a conductive metal silicide or combinations thereof. Preferably, the conductive material that is used in forming the conductive region 64 is a conductive metal such as Cu, W or Al, with Cu or a Cu alloy (such as AlCu) being highly preferred in the present invention. The conductive material is filled into each of the remaining openings 56 in the dielectric material 52 utilizing a conventional deposition process including, but not limited to: CVD, PECVD, sputtering, chemical solution deposition or plating. The resultant structure is shown for example in FIG. 2F.

Figure 2F:
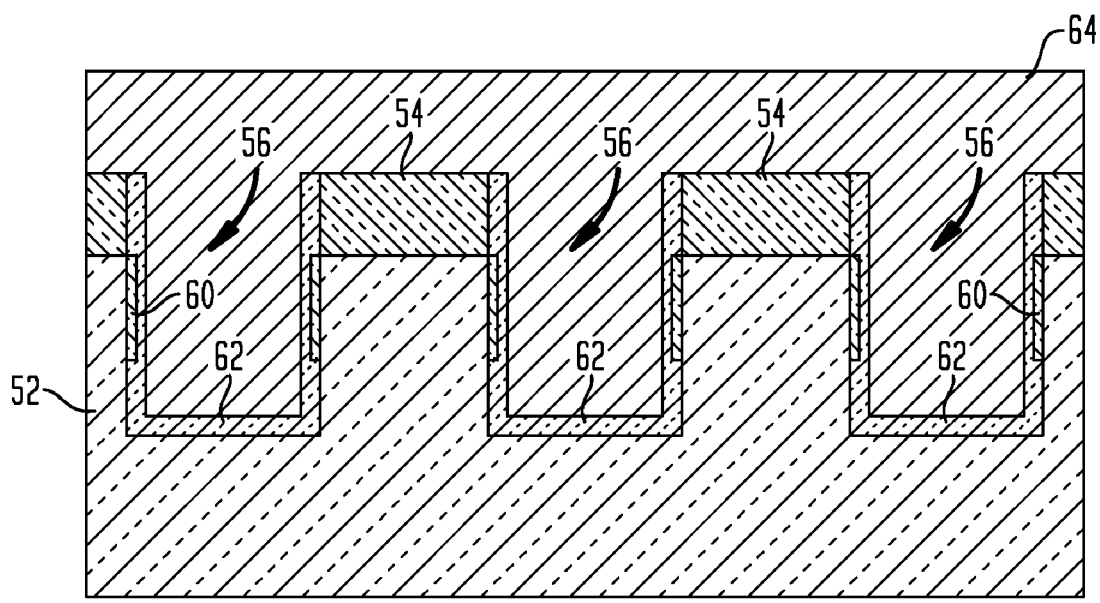

After providing the structure shown in FIG. 2F, a conventional planarization process such as chemical mechanical polishing (CMP) can be used to provide a structure in which the diffusion barrier 62 and the conductive region 64 each have an upper surface that is substantially coplanar with the upper surface of the dielectric material 52. The resultant structure is shown, for example, in FIG. 2G. It is noted that during the planarization process, the remaining sacrificial dielectric film 54 is removed from the structure.

Figure 2G:
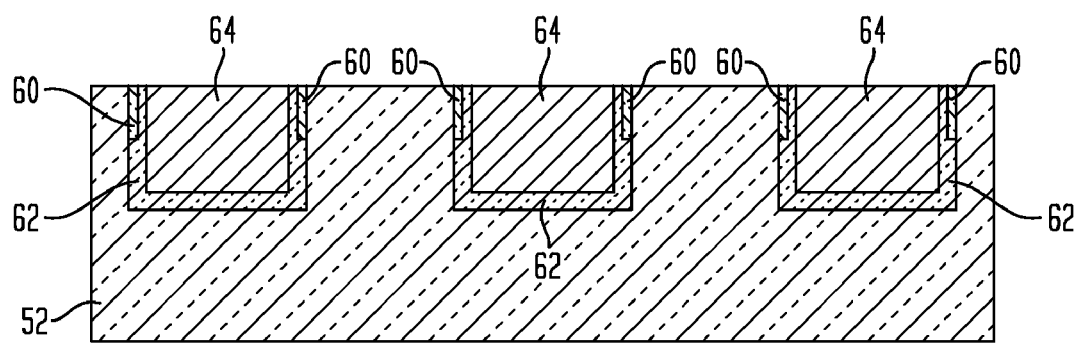
Figure 2H:
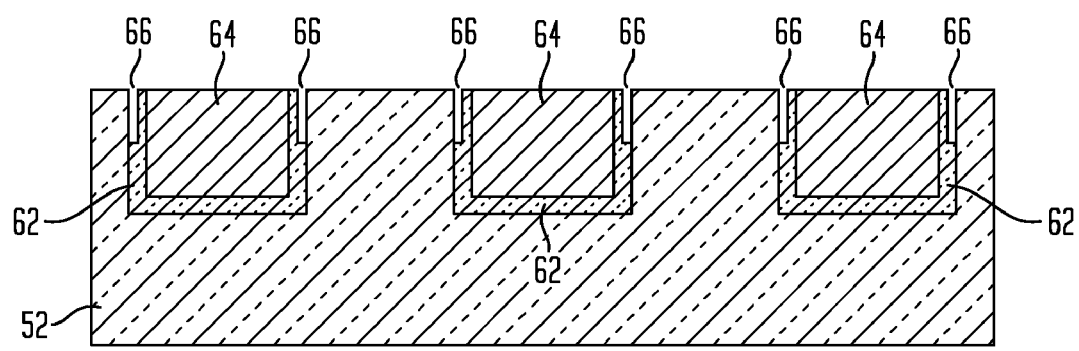

Next, and as shown in FIG. 2H, the surface oxide region 60 within an upper portion of the dielectric material 52 that is located adjacent the diffusion barrier 62 is then removed forming an air gap 66 between the diffusion barrier 62 and the dielectric material 52. Dilute HF or any other chemical etchant that selectively removes oxide can be used in creating the air gap 66.

Figure 2I:
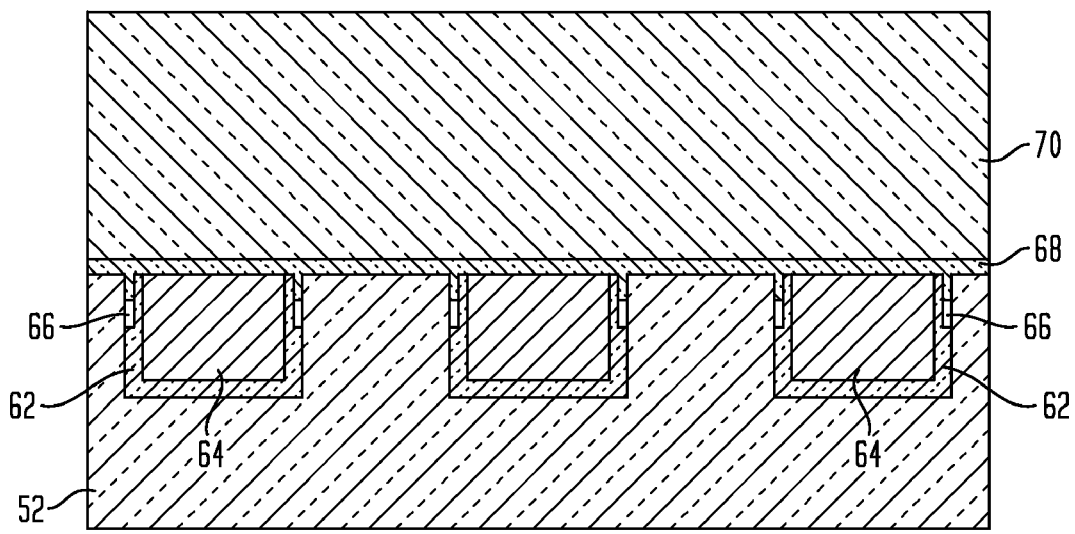

FIG. 2I shows an interconnect structure that is formed after applying a dielectric capping layer 68 and an upper dielectric material 70 to the previously processed dielectric material 52.

The dielectric capping layer 68 is formed on the surface of the structure shown in FIG. 2H (i.e., atop the dielectric material 52, diffusion barrier 62 and the conductive material of conductive region 64 and air gap 66) utilizing a conventional deposition process such as, for example, CVD, PECVD, chemical solution deposition, or evaporation. The dielectric capping layer 68 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the dielectric capping layer 68 may vary depending on the technique used to form the same as well as the material make-up of the layer. Typically, the dielectric capping layer 68 has a thickness from about 15 to about 55 nm, with a thickness from about 25 to about 45 nm being more typical.

It is noted that depending on the technique used in forming the dielectric capping layer 68, the dielectric capping layer 68 may completely or partially fill the air gap 66. FIG. 2I illustrates an embodiment in which the air gap 66 is partially filled with the dielectric capping layer 68.

The upper dielectric material 70 may comprise the same or different dielectric material as that of the dielectric material 52. The upper dielectric material 70 may be formed utilizing one of the above mentioned deposition processes and it can be processed to have conductive regions or features embedded therein utilizing the processing steps mentioned above.

Figure 3:
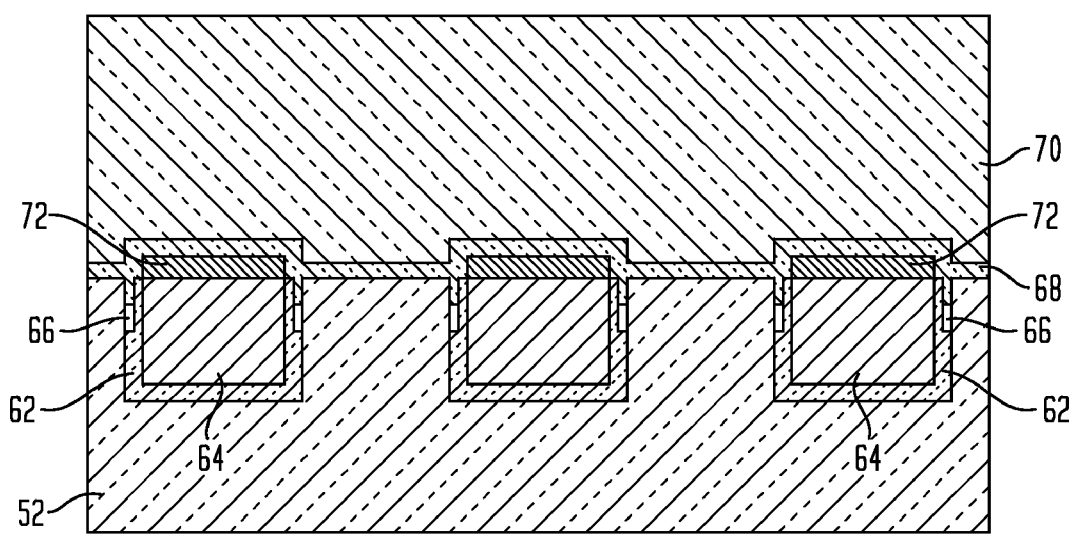
FIG. 3 is a pictorial representation (through a cross sectional view) illustrating an alternative interconnect structure that can be fabricated in accordance with another embodiment of the present invention.

FIG. 3 illustrates an alternative interconnect structure that can be fabricated in accordance with another embodiment of the present invention. In accordance with this embodiment of the present invention, the structure shown in FIG. 2G is first formed utilizing the techniques described above. A metal cap 72 is then formed on the exposed surface of the conductive material of conductive region 64. The metal cap 72 may be comprised of any metallic capping material including, but not limited to Ta and Co-containing materials. The term "Co-containing materials" is used herein to denote elemental Co alone or elemental Co and at least one of P and B. Optionally, W may be used in the Co-containing materials. When Co-containing materials are used as the metal cap 72, the metal cap 72 may comprise Co, CoP, CoWP, CoB or CoWP. Typically, CoP or CoWP are preferred Co-containing materials for the metal cap 72.

The thickness of the metal cap 72 formed may vary depending on the exact conditions of the technique used in forming the same. In general, the thickness of the metal cap 72 is from about 1 to about 20 nm, with a thickness from about 4 to about 10 nm being even more typical.

The metal cap 72 may be formed by a selective deposition process such as, for example, an electroless plating process. Alternatively, the metal cap 72 may be formed by a non-selective deposition process followed by lithography and etching.

When an electroless plating process is employed, a redox reaction involving the oxidation of one or more soluble reducing agent(s) and the reduction of one or more metallic ions occurs on the surface of a substrate. For many metals including Cu, Ni, Co, Au, Ag Pd, Rh, Pt, the freshly deposited surface is sufficiently catalytic for the process to continue.

A suitable electroless plating system used in this invention is based on the use of the hypophosphite reducing agent. In this system, a mixture of hypophosphite ions and cobalt ions is made together with citrate stabilizing agent, at a suitable pH and temperature (usually between 65° to 75° C.). When the activated catalyzed substrate described above is immersed on this plating bath, the following reaction occurs on the substrate:

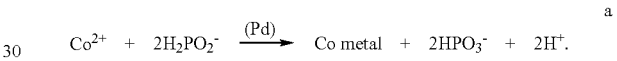

The Co metal is then deposited selectively on top of the conductive material of conductive region 64. The metal deposited by this reaction, can be either Co, CoP, CoWP, CoB or CoWB, depending on the composition of the plating bath solution.

Following the formation of the metal cap 72, the processing sequence as described above in connection with FIGS. 2H and 2I is followed to provide the structure shown in FIG. 3. It is again noted that the air gaps 66 can be unfilled, partially filled with the dielectric capping layer 68, or totally filled with the dielectric capping layer 68. FIG. 3 shows an embodiment wherein the air gaps 66 are partially filled with the dielectric capping layer 68.

Figure 4:
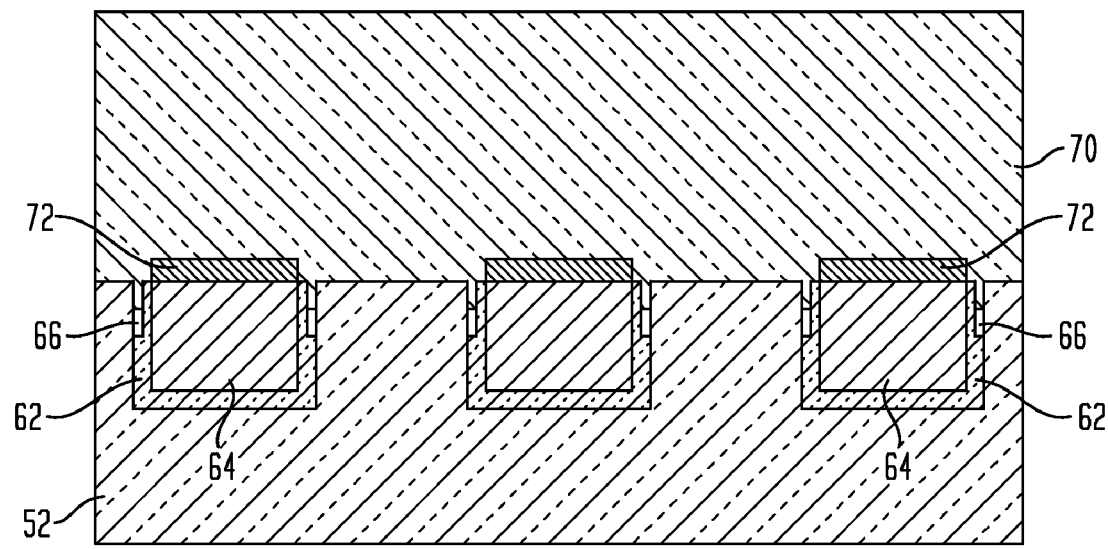
FIG. 4 is a pictorial representation (through a cross sectional view) illustrating yet another alternative interconnect structure that can be fabricated in accordance with a yet further embodiment of the present invention.

FIG. 4 illustrates yet another alternative interconnect structure that can be fabricated in accordance with a yet further embodiment of the present invention. This embodiment is similar to the embodiment depicted in FIG. 3 except that the dielectric capping layer 68 has been omitted. In the structure shown in FIG. 4, the upper dielectric material 70 partially fills the air gaps 66. The dielectric material 70 may also completely fill the air gaps 66 or the air gaps 66 may be left unfilled.

It is noted that in any of the embodiments mentioned above, a semiconductor interconnect structure having an air gap is provided in the upper surface of the dielectric material that is adjacent to a conductive region or feature. The air gap may be unfilled, partially filled or completely filled with either a dielectric capping layer or an upper dielectric material. The presence of the air gap in the upper surface of the dielectric material that is adjacent to the conductive region or feature provides a new interface that has a high mechanical strength and thus the resultant structure is highly reliable. Moreover, the new interface provided in the present invention has a high dielectric breakdown resistance which is important for future technology extendibility. Moreover, it is noted that the new interface is provided utilizing processing steps that are compatible with existing interconnect technology without added cost.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor interconnect structure comprising:
a dielectric material that has at least one conductive region embedded therein, said at least one conductive region is separated from said dielectric material by a refractory metal containing diffusion barrier and an air gap, said air gap is located within an upper portion of said diffusion baffler and laterally abuts said dielectric material at one edge, while another edge laterally abuts a remaining upper portion of said diffusion barrier.

2. The semiconductor interconnect structure of claim 1 wherein said dielectric material has a dielectric constant of about 4.0 or less.

3. The semiconductor interconnect structure of claim 2 wherein said dielectric material comprises $SiO_2$, silsesquioxanes, C doped oxides, thermosetting polyarylene ethers or multilayers thereof.

4. The semiconductor interconnect structure of claim 1 wherein said diffusion baffler comprises Ta, TaN, Ti, TiN, Ru, RuN, RuTa, RuTaN, W, WN or multilayers thereof.

5. The semiconductor interconnect structure of claim 1 wherein said at least one conductive region comprises a conductive material selected from the group consisting of polySi, a conductive metal, an alloy of at least one conductive metal, a conductive metal silicide and combinations thereof.

6. The semiconductor interconnect structure of claim 5 wherein said conductive material is one of Cu, W, Al and a Cu alloy.

7. The semiconductor interconnect structure of claim 6 wherein said conductive material is Cu or a Cu alloy.

8. The semiconductor interconnect structure of claim 1 wherein said air gap is completely or partially filled with a dielectric capping layer.

9. The semiconductor interconnect structure of claim 8 wherein said dielectric capping layer comprises SiC, $Si_4H_3$, $SiO_2$, a carbon doped oxide, a nitrogen and hydrogen doped silicon carbide or multilayers thereof 10. The semiconductor interconnect structure of claim 1 further comprising a metal cap disposed on said at least one conductive region.

11. The semiconductor interconnect structure of claim 1 wherein said air gap is completely or partially filled with another dielectric material, said another dielectric material having a dielectric constant of about 4.0 or less.

12. A semiconductor interconnect structure comprising:
a lower dielectric material that has at least one conductive region embedded therein, said at least one conductive region is separated from said lower dielectric material by a refractory metal containing diffusion barrier and an air gap, said air gap is located within an upper portion of said diffusion baffler and laterally abuts said lower dielectric material at one edge, while another edge laterally abuts a remaining upper portion of said diffusion barrier;
a dielectric capping layer disposed at least on said lower dielectric material, wherein a portion of said dielectric capping layer is located within said air gap; and
an upper dielectric material located on said dielectric capping layer.

13. The semiconductor interconnect structure of claim 12 further comprising a metal cap disposed on said at least one conductive region.

14. A semiconductor interconnect structure comprising:
a lower dielectric material that has at least one conductive region embedded therein, said at least one conductive region is separated from said lower dielectric material by a refractory metal containing diffusion barrier and an air gap, said air gap is located within an upper portion of said diffusion barrier and laterally abuts said lower dielectric material at one edge, while another edge laterally abuts a remaining upper portion of said diffusion barrier;
a metal cap disposed on said at least one conductive region; and
an upper dielectric material located on said dielectric capping layer, wherein a portion of said upper dielectric material is located within said air gap.

* * * * *